United States Patent
Fujinawa

(10) Patent No.: US 8,986,795 B2
(45) Date of Patent: Mar. 24, 2015

(54) MANUFACTURING METHOD OF FUNCTIONAL FILM

(71) Applicant: FUJIFILM Corporation, Tokyo (JP)

(72) Inventor: Jun Fujinawa, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/012,424

(22) Filed: Aug. 28, 2013

(65) Prior Publication Data

US 2013/0344257 A1     Dec. 26, 2013

Related U.S. Application Data

(63) Continuation of application No. PCT/JP2012/054725, filed on Feb. 27, 2012.

(30) Foreign Application Priority Data

Mar. 8, 2011    (JP) ................................. 2011-050108

(51) Int. Cl.
    *C23C 16/44*     (2006.01)
    *C23C 16/509*     (2006.01)
    *C23C 16/54*     (2006.01)

(52) U.S. Cl.
    CPC ........... *C23C 16/4408* (2013.01); *C23C 16/509* (2013.01); *C23C 16/545* (2013.01); *C23C 16/4401* (2013.01)
    USPC ...................................................... 427/569

(58) Field of Classification Search
None
See application file for complete search history.

(56) References Cited

U.S. PATENT DOCUMENTS

2010/0261008 A1*    10/2010    Kikuchi ................. 428/332

FOREIGN PATENT DOCUMENTS

JP     2003-142472 A     5/2003
JP     2011-006788 A     1/2011

OTHER PUBLICATIONS

JP2003-142472, Yokoyama, May 2003, English machine translation.*
International Search Report issued in PCT/JP2012/054725, dated May 22, 2012.
Japanese Notice of Reasons for Rejection issued by JPO on Aug. 26, 2014 in connection with corresponding Japanese Patent Application No. 2011-050108.

* cited by examiner

*Primary Examiner* — Joseph Miller, Jr.
(74) *Attorney, Agent, or Firm* — Jean C. Edwards, Esq; Edwards Neils PLLC

(57) ABSTRACT

When manufacturing a functional film to be formed by using a plasma CVD method while transporting an elongated substrate in a longitudinal direction, an object is to provide a manufacturing method which can prevent a product or the inside of a film forming system from being contaminated during the exposure to air after the film forming is stopped, and can improve productivity and a product quality. The object is achieved by introducing a gas for the exposure to the air into the film forming system after hindering a surface of a film forming electrode from coming into contact with the air inside the film forming system.

6 Claims, 6 Drawing Sheets

MANUFACTURING METHOD OF FUNCTIONAL FILM

CROSS-REFERENCE TO RELATED APPLICATIONS

This application is a Continuation of International Application No. PCT/JP2012/054725 filed on Feb. 27, 2012, which was published under PCT Article 21(2) in Japanese, which is based upon and claims the benefit of priority from Japanese Patent Application No. 2011-050108 filed on Mar. 8, 2011, the contents both of which are incorporated herein by reference.

BACKGROUND OF THE INVENTION

1. Field of the Invention

The present invention relates to a manufacturing method of a functional film such as a gas barrier film by forming a film using a plasma CVD method while transporting an elongated substrate in the longitudinal direction.

2. Description of the Related Art

Various types of devices such as an optical element, a display device of a liquid crystal display or an organic EL display, a semiconductor device, and a thin film solar cell have adopted various types of functional films (functional sheet) such as optical films of a gas barrier film, a protective film, an optical filter and an anti-reflection film.

The plasma CVD method has been used in manufacturing these functional films.

In addition, without being limited to the plasma CVD method, in order to efficiently form a film while ensuring high productivity, it is preferable to continuously form the film while transporting an elongated substrate (web-shaped substrate) in the longitudinal direction.

As a device for implementing such a film forming method, a so-called Roll to Roll (hereinafter, referred to as R to R) film forming device has been known which feeds a substrate from a substrate roll formed by winding the elongated substrate in a roll shape and winds the film formed substrate in a roll shape.

The R to R film forming device feeds the elongated substrate along a predetermined transportation route from the substrate roll to a winding shaft (passing the substrate to a predetermined transportation route) in a predetermined route including a film forming position, synchronizes feeding of the substrate from the substrate roll with winding of the film formed substrate by using the winding shaft, and continuously forms the film on the substrate transported in the longitudinal direction at the film forming position.

As is well known, the plasma CVD (capacity coupled plasma CVD) method is to generate a plasma and form the film in such a manner that an electrode pair configured to have a film forming electrode and a counter electrode is formed by interposing the film forming substrate therebetween, a film forming gas (process gas) is supplied to across the electrode pair, and a high frequency power is supplied to the film forming electrode.

Here, in the film forming by using the plasma CVD (film forming by using the vapor phase deposition) method, in the film forming system, the film may adhere to or may be deposited on various areas other than the substrate. In particular, a large amount of the film may adhere to a surface of the film forming electrode (opposing surface to the counter electrode (substrate)).

In a general single wafer processing type (batch type) film forming device which sequentially takes in and out the film forming substrate (processing substrate), if the film forming is completed, a cleaning gas is introduced into the film forming system instead of the film forming gas to remove the film adhering to the film forming electrode.

However, in order to improve productivity, the R to R device which continuously performs the film forming for a long period of time may result in the film forming electrode on which a very large amount of the film is deposited. Therefore, it requires a lot of time to remove the film adhering to the film forming electrode by using the cleaning gas, thereby causing significantly lowered productivity.

Therefore, in the R to R device, in order to quickly perform the cleaning (purification) on the film forming electrode, a method has been considered which removes the film forming electrode and parts to replace them with a new film forming electrode and the like (cleaned film forming electrode and the like), and externally cleans the film forming electrode on which the film is deposited.

SUMMARY OF THE INVENTION

However, this method results in the film forming system (film forming space) exposed to air in a state where a large amount of the film is deposited on the surface of the film forming electrode. Therefore, when exposed to the air, a large amount of the film adhering to the film forming electrode is separated from the surface of the film forming electrode due to a sudden change in temperature (thermal stress) caused by air introduction, and the intense airflow, and the film becomes so-called particles to scatter around the entire film forming system and adheres to various areas.

As a result, it is necessary to clean the inside of the film forming system in order to remove the particles, thereby also causing the lowered productivity.

In addition, when using the single wafer processing type film forming device, the inside of the film forming system is exposed to the air after the cleaning by using the above-described cleaning gas, and when exposed to the air, the film formed substrate is generally retracted to a space different from the film forming system. Therefore, the film formed substrate as a pre-production substrate is rarely contaminated by the scattering of the particles when exposed to the air.

In contrast, when using the R to R film forming device, an effort to feed the substrate (to transport the substrate on the transportation route) is considered. Thus, in many cases, the film formed substrate as a pre-production substrate remains inside the film forming system and in that state, the inside of the film forming system is exposed to the air. In this case, the particles scattered when exposed to the air adhere to the surface or rear surface of the film formed substrate. This results in damage to or contamination of the formed film, thereby causing a lowered quality of the product. In addition, if the film formed substrate to which the particles adhere is wound, the particles come into contact with or adhere to the adjacent substrate (laminated substrate). This also results in the damage to the film formed substrate or the contamination of the product, thereby causing the degraded quality of the product.

Even in the same R to R film forming device, a sputtering device adopts a method where the adhesion force of the film is strong in principle and in addition, the film forming does not depend on the mutual reaction of gasses. Accordingly, a position of the film to be deposited on a cathode is limited. Therefore, there is no problem of the separated film or scattered particles when the inside of the film forming system is exposed to the air.

However, the film deposited by the plasma CVD method has a weaker force adhering to a member than the film deposited by the sputtering. In particular, a large amount of the film entirely adheres to and is deposited on the surface of the film forming electrode. Therefore, it is difficult to separate a large amount of the film deposited on the film forming electrode, or to prevent the particles from scattering inside the film forming system.

In addition, as described above, the reason why the film adhering to or deposited on the film forming electrode is separated to become the particles is considered that a heated member is rapidly cooled down due to the introduction of the air and a difference of the thermal stresses between the member and the film causes the film to be separated.

In order to prevent the separated film resulting from the thermal stress, it is also possible to expose the film formed substrate to the air by controlling the temperature of the film formed substrate with the aid of warm water or a chiller. However, the film forming electrode of the plasma CVD method comes to have a high temperature of approximately several hundred degrees centigrade. Therefore, in terms of productivity or in terms of safety, it is very difficult to maintain the temperature of the film forming electrode during the introduction of the air.

Furthermore, in order to prevent the separation of the film adhering to or deposited on the film forming electrode and the scattering of the particles inside the film forming system, it is also possible to use a so-called slow vent mechanism which very slowly introduces the air to the film forming system and thus does not allow a sudden change in the airflow during the air exposure.

However, the film is ultimately separated due to a change in temperature of the film formed substrate. Furthermore, when using the slow vent mechanism, it takes a lot of time from the completion of the film forming until when the film forming system is exposed to the air. As a result, the productivity is lowered.

In order to solve the above-described disadvantages in the related art, when manufacturing the functional film to be formed by means of the plasma CVD method using R to R, an object of the present invention is to provide a manufacturing method of a functional film which can prevent the inside of the film forming system from being contaminated due to the fact that the film adhering to or deposited on the film forming electrode is separated when the film forming system is exposed to the air after the film forming is stopped (completed), and thus the generated particles are scattered in the film forming system to adhere to the entire area inside the film forming system.

A manufacturing method of a functional film according to the present invention, which is obtained by achieving the above-described object, includes forming a film on a surface of a substrate by using a plasma CVD method while transporting the elongated substrate in the longitudinal direction; stopping the film forming on the substrate; and exposing an inside of a film forming system to the air, wherein the exposing the inside of the film forming system to the air is conducted by introducing the air into the film forming system in a state where a surface of a film forming electrode for forming the film using the plasma CVD method is hindered from coming into contact with the air inside of the film forming system (in other words, after the surface of the film forming electrode is not in an exposed state inside the film forming system). In the description, the term "a state where the surface of the film forming electrode is hindered from coming into contact with the air inside the film forming system" means that at least a portion (more preferably all portions) of the surface of the film forming electrode is hindered from coming into contact with the air inside the film forming system.

In the manufacturing method of the functional film according to the present invention, it is preferable to cover the surface of the film forming electrode with a predetermined cover to hinder the surface of the film forming electrode from coming into contact with the air inside the film forming system. In addition, it is preferable that the predetermined cover has a shape capable of covering the surface of the film forming electrode the cover to come into contact with the entire surface of the film forming electrode. In addition, it is preferable that the covering the surface of the film forming electrode with the predetermined cover is conducted by moving and inserting the predetermined cover to between the film forming electrode and a counter electrode forming an electrode pair with the film forming electrode, followed by moving the film forming electrode.

In addition, it is preferable to bring the surface of the film forming electrode into contact with the surface of the counter electrode to hinder the surface of the film forming electrode from coming into contact with the air inside the film forming system, wherein the surface of the film forming electrode and the surface of the counter electrode forming an electrode pair with the film forming electrode is caused to have a shape enabling thorough contact with each other. In addition, it is preferable that the bringing the surface of the film forming electrode into contact with the surface of the counter electrode is conducted by moving the film forming electrode.

Furthermore, it is preferable that the surface of the film forming electrode is hindered from coming into contact with the air inside the film forming system by positioning the film forming electrode in another space separated from the film forming system.

In addition, it is preferable that the surface of the film forming electrode is hindered from coming into contact with the air inside the film forming system in a state where the elongated substrate passes through a predetermined transportation route.

In addition, it is preferable that the forming the film on the surface of the substrate by using the plasma CVD method while transporting the elongated substrate in the longitudinal direction is conducted in a state where the elongated substrate is wound around a cylindrical drum, and the cylindrical drum is caused to act as the counter electrode forming an electrode pair with the film forming electrode.

In addition, it is preferable that the forming the film is conducted while feeding the substrate from a substrate roll which is formed by winding the elongated substrate in a roll shape, and the film formed substrate is wound again in the roll shape.

Furthermore, it is preferable that the film forming electrode is provided with a supply unit for supplying film forming gas to form the film by using the plasma CVD method.

The manufacturing method of the functional film according to the present invention includes forming the film such as a gas barrier film by using the plasma CVD method while transporting the elongated substrate in the longitudinal direction; and introducing the air into the film forming system after hindering the surface of the film forming electrode from coming into contact with the air inside the film forming system (in other words, after the surface of the film forming electrode is not in a state exposed to the film forming system), when subsequently stopping (completing) the film forming and exposing the film forming system to the air (during a vacuum break/when a vacuum is broken).

Therefore, according to the manufacturing method of the present invention, when the film forming system is exposed to the air, it is possible to prevent a large amount of the adhering or deposited film on the surface of the film forming electrode from being separated to become the particles and being scattered inside the film forming system due to a suddenly lowered temperature and the intense airflow which are caused by the introduction of the air (gas for the exposure of the film forming system to the air). That is, according to the manufacturing method of the present invention, it is possible to considerably suppress the scattering of the particles (film) inside the film forming system or the adhering of the particles to various sections and the substrate of each film forming system during the exposure to the air.

Therefore, according to the present invention, it is possible to quickly expose the film forming system to the air without performing the slow vent or the temperature control after stopping the film forming. Furthermore, it is possible to considerably reduce the efforts and time required for cleaning such as the removal of the particles inside the film forming system after the exposure to the air.

Consequently, according to the manufacturing method of the present invention, it is possible to manufacture the functional film such as the gas barrier film with excellent productivity.

In addition, since the particles scattered due to the exposure to the air can be prevented from adhering to the film formed substrate (product), it is possible to prevent the film formed substrate from being damaged due to the contamination of the film formed substrate by the particles or the adhering of the particles. Furthermore, it is also possible to prevent the particles from being dragged into the film formed substrate by winding the film formed substrate to which the particles adhere. Therefore, it is possible to prevent the contamination of the adjacent film formed substrate (substrate which is laminated by winding) or the damage to the film which is caused by the dragging of the particles.

Furthermore, since the scattering of the particles can be considerably suppressed, the cleaning performance inside the film forming system can be improved. It is also possible to suppress the particles which cannot be removed by the cleaning from being deposited on the film forming system. As a result, it is also possible to considerably suppress the deterioration of the product quality caused by the contamination inside the film forming system. Thus, a high quality product can be stably manufactured over a long term period.

DESCRIPTION OF THE PREFERRED EMBODIMENTS

Hereinafter, a manufacturing method of a functional film according to the present invention will be described with reference to preferred embodiments illustrated in the accompanying drawings.

Figure 1:
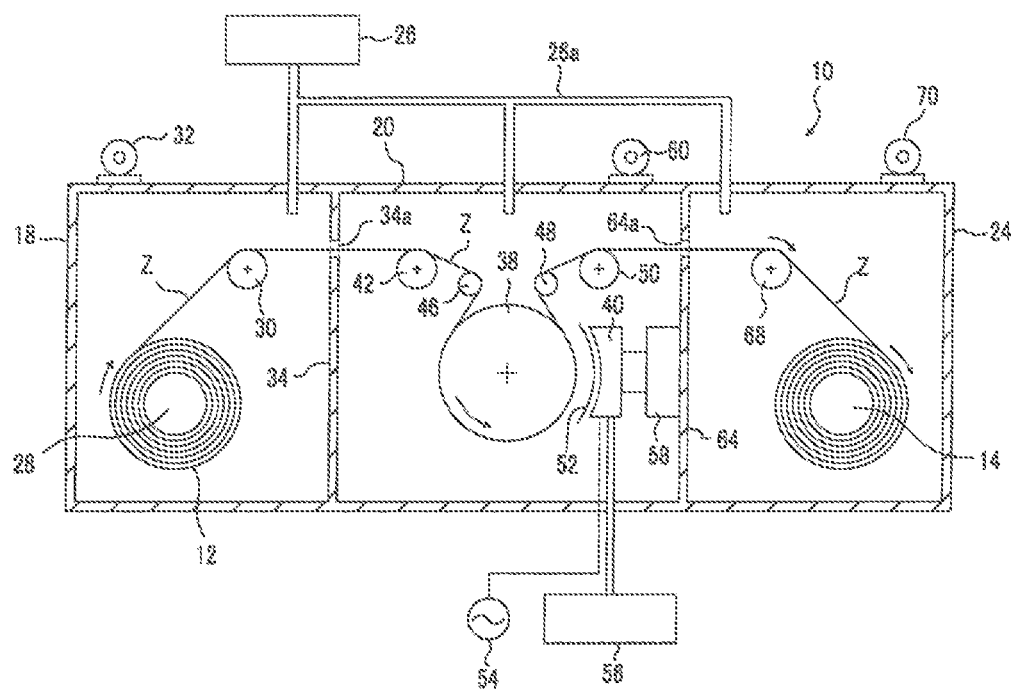
FIG. 1 is a conceptual diagram illustrating an example of a plasma CVD device for embodying an example of a manufacturing method of a functional film according to the present invention.

FIG. 1 conceptually illustrates an example of a plasma CVD device for embodying an example of the manufacturing method of the functional film according to the present invention.

A plasma CVD device 10 (hereinafter, referred to as a CVD device 10) illustrated in FIG. 1 forms a film, by using a CCP-CVD (Capacitively Coupled Plasma) method, on a surface of a substrate Z, while transporting the elongated substrate Z (web-like original film plate), and then manufactures the functional film such as a gas barrier film and various optical films.

In addition, the CVD device 10 is a film forming device using a so-called roll to roll method (hereinafter, referred to as R to R) which feeds the substrate Z from a substrate roll 12 formed by winding the elongated substrate Z in a roll shape, transports the substrate Z in the longitudinal direction, forms the film inside a decompressed film forming system (film forming space), and then winds the film formed substrate Z again in the roll shape around a winding shaft 14.

In the manufacturing method of the present invention, the substrate (base material/base body) for forming the film is not particularly limited, but if the film forming is available by using the plasma CVD method, various elongated sheet-like materials can all be used.

More specifically, the preferably useable substrate Z includes a plastic (resin) film consisting of organic materials such as polyethylene terephthalate (PET), polyethylene naphthalate (PEN), polyethylene, polypropylene, polystyrene, polyamide, polyvinyl chloride, polycarbonate, polyacrylonitrile, polyimide, polyacrylate, and polymethacrylate.

In addition, in the present invention, as a support body for the plastic film, sheet-like materials having upper layers (films) for obtaining various functions, such as a protective layer, adhesive layer, light reflection layer, light shielding layer, planarization layer, buffer layer, and stress relaxing layer, may be used for the substrate Z.

In this case, a sheet-like material having only one layer on a substrate may be used as the substrate Z. Alternatively, a sheet-like material having a plurality of layers on a substrate may be used as the substrate Z. In addition, if the substrate Z is a sheet-like material having a plurality of layers on a substrate, the substrate Z may have a plurality of the same layers.

As described above, the CVD device 10 illustrated in FIG. 1 is the film forming device using the so-called roll to roll method which feeds the substrate Z from a substrate roll 12 formed by winding the elongated substrate Z, transports the substrate Z in the longitudinal direction, forms the film, and then winds the film formed substrate Z again in the roll shape around the winding shaft 14. The CVD device 10 has a supply chamber 18, a film forming chamber 20, a winding chamber 24 and an air exposure unit 26.

In addition to the illustrated members, the CVD device 10 may include various members having devices for forming the film on the elongated substrate Z by means of R to R using the plasma CVD method, such as various sensors, a transportation roller pair, a guide member for regulating the position of the substrate Z in the width direction, and various members (transportation means) for transporting the substrate Z through a predetermined route.

The air exposure unit 26, when stopping the film forming (completing the film forming) on the substrate Z, exposes the supply chamber 18, the film forming chamber 20 and the winding chamber 24 to the air, and enables the respective chambers to be exposed. In the illustrated example, the air exposure unit 26 is connected to the supply chamber 18, the film forming chamber 20 and the winding chamber 24 by an introduction line 26a.

The air exposure unit 26 is known an air exposure unit used in a vacuum film forming device (vapor phase film forming (deposition) device), which introduces the air purified by a filter or the like (air outside the device) to the respective chambers through the introduction line 26a, and exposes the supply chamber 18, the film forming chamber 20 and the winding chamber 24 to the air by causing the respective chambers to recover an atmospheric pressure.

The air exposure unit 26 is not limited to one which introduces the air to the respective chambers to be exposed, but may be one which introduces an inert gas such as nitrogen to the respective chambers to be exposed. Alternatively, the introduction of the air and the introduction of the inert gas may be selectable.

Furthermore, even if the air exposure unit 26 introduces the air equally to the supply chamber 18, the film forming chamber 20 and the winding chamber 24, the air exposure unit 26 may be capable of controlling the introduction amount of the air for each chamber.

The supply chamber 18 has a rotary shaft 28, a guide roller 30 and a vacuum ventilation unit 32.

The substrate roll 12 formed by winding the elongated substrate Z is mounted on the rotary shaft 28 of the supply chamber 18.

If the substrate roll 12 is mounted on the rotary shaft 28, the substrate Z is pulled out from the substrate roll 12, passes through the film forming chamber 20 from the supply chamber 18, and is fed through a predetermined transportation route to a winding shaft 14 of the winding chamber 24 (substrate Z passes through a predetermined transportation route).

In the CVD device 10, feeding the substrate Z from the substrate roll 12 is performed in synchronization with winding the substrate Z in the winding shaft 14 of the winding chamber 24. While the elongated substrate Z is transported in the longitudinal direction through a predetermined transportation route, the film is continuously formed on the substrate Z in the film forming chamber 20 by using the CCP-CVD method.

In the supply chamber 18, the rotary shaft 28 is rotated clockwise (in the drawing) by a drive source (not illustrated), the substrate Z is fed from the substrate roll 12, the substrate Z is guided to the predetermined route by the guide roller 30 to be sent to the film forming chamber 20 from a slit 34a disposed on a partition wall 34.

In the CVD device 10 of the illustrated example, as a preferable aspect, a vacuum ventilation unit 32 is disposed in the supply chamber 18, and a vacuum ventilation unit 70 is disposed in the winding chamber 24, respectively. In the CVD device 10, during the film forming, the respective vacuum ventilation unit maintain the pressure in the supply chamber 18 and the winding chamber 24 to have a predetermined pressure according to the pressure (film forming pressure) of the film forming chamber 20 (to be described later). This prevents the pressure in the adjacent chamber from affecting the pressure of the film forming chamber 20 (that is, the film forming in the film forming chamber 20).

In the vacuum ventilation unit 32, without being particularly limited, various known (vacuum) ventilation units can be used which are adopted to the vacuum film forming device using a vacuum pump such as a turbo pump, mechanical booster pump, dry pump, and rotary pump, and a further auxiliary unit such as a cryogenic coil, and a control unit for ultimate vacuum or an exhaust amount. In this regard, the other vacuum ventilation units 60 and 70 (to be described later) are also similar.

As described above, the substrate Z is guided by the guide roller 30 and transported from the slit 34a on the partition wall 34 to the film forming chamber 20.

In the film forming chamber 20, the film is formed (deposited) on the surface of the substrate Z by using the CCP-CVD method. In the illustrated example, the film forming chamber 20 has a drum 38, a film forming electrode 40, guide rollers 42, 46, 48 and 50, an electrode cover 52, a high frequency power source 54, a gas supply unit 56, an electrode moving unit 58 and the vacuum ventilation unit 60. In addition, although not illustrated in the drawing, in order to indicate a simple and concise configuration of the film forming chamber 20, the film forming chamber 20 also has cover a moving unit for moving the electrode cover 52.

The drum 38 of the film forming chamber 20 is a cylindrical-shaped member which is rotated counterclockwise (in the drawing) around the center line, winds the substrate Z guided to a predetermined route by the guide rollers 42 and 46 around a predetermined region on the circumferential surface (predetermined winding angle), and transports the substrate Z in the longitudinal direction while holding the substrate Z at a predetermined position to face the film forming electrode 40 (to be described later).

The drum 38 also acts as a counter electrode in the CCP-CVD method (that is, the drum 38 and the film forming electrode 40 form an electrode pair).

Therefore, a bias power source for supplying a bias power may be connected to the drum 38, or may be grounded. Alternatively, the connection to the bias power source and the ground may be switchable.

In addition, the drum 38 may have a temperature control unit for controlling the temperature of the substrate Z during the film forming. The temperature control unit of the drum 38, without being particularly limited, can adopt various temperature control units such as the temperature control unit for circulating refrigerant or hot media inside the drum.

The film forming electrode 40 is a so-called known shower electrode (shower plate) which ejects the film forming gas from the opposing surface of the substrate Z and is used in forming the film by using the CCP-CVD method.

In the illustrated example, as an example, the film forming electrode 40 has a substantially rectangular parallelepiped shape in which one surface thereof is arranged to face the drum 38 (that is, the substrate Z) and a space (gas supply space) is formed inside. The surface opposing (facing) the drum 38 of the film forming electrode 40 is a curved surface in a concave shape such that the drum 38 is in parallel with the circumferential surface (that is, such that the interval between the drum 38 and the film forming electrode is entirely uniform).

The film forming electrode 40 may also have the known temperature control unit similarly to the drum 38.

The surface opposing the drum 38 of the film forming electrode 40 (that is, the surface opposing the substrate Z for forming the film (=surface to be exposed to the film forming gas and plasma)) is the surface of the film forming electrode 40 in the manufacturing method of the present invention.

In addition, as a preferable aspect, the surface of the film forming electrode 40 has minute concavity and convexity of a predetermined size (is roughened). This can preferably prevent the film deposited on the surface thereof from being separated during the film forming.

As described above, the film forming electrode 40 is the so-called shower electrode, the surface of which has a large number of gas supply holes. The gas supply holes communicate with the above-described internal space (gas supply space) of the film forming electrode 40. In addition, a gas supply unit 56 (to be described later) supplies the film forming gas to the internal space of the film forming electrode 40.

Therefore, the film forming gas supplied from the gas supply unit 56 is supplied to between the drum 38 (substrate Z) and the film forming electrode 40 through the gas supply holes of the film forming electrode 40.

In the present invention, the film forming electrode 40 is not limited to have the curved surface as is similar to the illustrated example, but may be a rectangular parallelepiped shape having the internal space (gas supply space), or may have the curved surface which is not in parallel with the circumferential surface of the drum.

That is, in the present invention, all of the known shower electrodes used for the CCP-CVD method can be used.

In the illustrated example, one film forming electrode 40 (film forming unit using the CCP-CVD method) is arranged in the film forming chamber 20. However, the present invention, without being limited to this, may have a plurality of the film forming electrodes arrayed in the transporting direction of the substrate Z. In this case, an electrode cover 52 (to be described later) and a cover moving unit are to be disposed corresponding to the individual film forming electrode.

In addition, the present invention is not limited to the configuration adopting the shower electrode, but may adopt the CCP-CVD method using an electrode having no outlet (film forming gas supply unit) for the film forming gas and a nozzle for supplying the film forming gas to between the electrode pair.

The gas supply unit 56 is known a gas supply unit used for the vacuum deposition device such as the plasma CVD device.

As described above, the gas supply unit 56 supplies the film forming gas to the internal space of the film forming electrode 40. In addition, a large number of gas supply holes communicating with the internal space are formed on the surface (surface opposing the drum 38) of the film forming electrode 40. Therefore, the film forming gas being supplied to the film forming electrode 40 is supplied to between the film forming electrode 40 and the drum 38 from the gas supply holes.

A supply tube for supplying the film forming gas from the gas supply unit 56 to the film forming electrode 40 is a tube, at least a portion of which has flexibility (flexible tube) according to a movement (to be described later) of the film forming electrode 40.

The film formed by using the manufacturing method of the present invention (that is, the functional film to be manufactured) is not particularly limited, but may be various formable films, that is, films having various optical characteristics, such as a gas barrier film (water vapor barrier film), a light reflection preventing film and a wavelength band filter film, and films having functions required for the functional film to be manufactured, such as a protective film.

Therefore, the film forming gas (process gas/raw material gas) supplied by the gas supply unit 56 may be a known gas depending on the films to be formed on the surface of the substrate Z.

For example, when the CVD device 10 forms a silicon nitride film on the surface of the substrate Z and manufactures the gas barrier film, the gas supply unit 56 may supply the film forming electrode 40 with the known gas used in forming the silicon nitride film by using the CCP-CVD method. Specifically, when forming the silicon nitride film, as the film forming gas, the gas supply unit 56 may supply a combined gas of a silane gas, ammonia gas and hydrogen gas or a combined gas of the silane gas, ammonia gas and nitrogen gas.

The high frequency power source 54 is a power source for supplying plasma excitation power to the film forming electrode 40. The high frequency power source 54 can adopt all of the known high frequency power sources used for various plasma CVD devices, such as power sources which supply high frequency power of 13.56 MHz.

The power supply from the high frequency power source 54 to the film forming electrode 40 is performed by a power supply line, at least a portion of which has flexibility.

The vacuum ventilation unit 60 is known a vacuum ventilation unit that ventilates the inside of the film forming chamber in order to form the film by using the plasma CVD method, maintains a predetermined film forming pressure, and is used for the vacuum deposition device as described above.

In the manufacturing method of the present invention, the film forming conditions are not particularly limited in the transporting speed of the substrate Z, film forming pressure, supply amount of the film forming gas, strength of the plasma excitation power.

That is, similarly to the film forming by using the usual plasma CVD method, the film forming conditions may be appropriately set depending on the film to be formed, required film forming speed, film thickness to be formed and types of the substrate Z.

Here, in the CVD device 10 in the illustrated example, the film forming chamber 20 further includes an electrode cover 52, an electrode moving unit 58 and a cover moving unit (not illustrated).

The electrode cover 52 has a convex-shaped and curved surface where one surface has the same curvature as that of the film forming electrode 40. The electrode cover 52 is a plate-shaped member (plate-shaped mask member) where the curved surface has a larger area than the surface of the film forming electrode 40. Accordingly, the convex-shaped and curved surface of the electrode cover 52 can come into contact with and cover the entire surface of the film forming electrode 40.

The electrode cover 52 is arranged such that the convex-shaped and curved surface toward the surface of the film forming electrode 40. Furthermore, the electrode cover 52 is moved in the horizontal direction (direction perpendicular to the paper surface in FIG. 1) by the cover moving unit, and is moved to between the film forming electrode 40 and the drum 38, and the position retracted from between the film forming electrode 40 and the drum 38 (position which does not affect the film forming).

In addition, the electrode moving unit 58 moves the film forming electrode 40 in the direction of approaching the drum 38 and in the direction away from the drum 38.

As long as the electrode moving unit 58 and the cover moving unit can be operated in a vacuum state, various moving units such as known housing-like materials and plate-shaped materials can be used.

In the CVD device 10, when the film forming is stopped and the inside of the device is exposed to the air, the electrode cover 52 is inserted to between the drum 38 and the film forming electrode 40, and then the film forming electrode 40 is moved toward the drum 38. After the entire surface of the film forming electrode 40 is covered with the electrode cover 52, the air exposure unit 26 introduces the air to the film forming chamber 20.

According to the above-described configuration, the present invention prevents that the film adhering to or deposited on the surface of the film forming electrode 40 is separated to generate the particles when the film forming chamber is exposed to the air after the film forming is stopped, and thus the generated particles are scattered inside the CVD device 10.

In addition, the electrode cover is not limited to the plate-shaped material as is similar to the illustrated example. For example, as is similar to the electrode cover 52a illustrated in FIG. 2, the electrode cover may be a cap-shaped (lid-shaped) material into which the film forming electrode 40 is fitted and which comes into contact with and covers the entire surface of the film forming electrode 40. That is, in the present invention, as long as the electrode cover can entirely cover the surface of the film forming electrode 40, the cover having various configurations and shapes can be used.

Furthermore, as is similar to the illustrated example, the electrode cover is not limited to the configuration where the electrode cover comes into contact with the surface of the film forming electrode 40 and covers the entire surface of the film forming electrode 40. For example, the electrode cover may have a cap shape which covers the entire surface in a state of being away from the surface of the film forming electrode 40. However, in view of the fact that it is possible to more reliably prevent the separated film from the surface of the film forming electrode 40 or the scattered particles, it is preferable that the electrode cover, as illustrated in the configuration in FIGS. 1 and 2, have a configuration and shape to cover the entire surface by coming into contact with (abutting on) the entire surface of the film forming electrode.

As described above, the substrate Z guided to a predetermined route by the guide rollers 42 and 46 is wound around the circumferential surface of the drum 38, maintained at a predetermined position, and transported in the longitudinal direction. The plasma is excited across the electrode pair formed from the drum 38 and the film forming electrode 40 by supplying the plasma excitation power to the film forming electrode 40. Then, the radical is generated from the film forming gas, and the film is formed on the surface of the substrate Z maintained and transported by the drum 38 by using the CCP-CVD method.

The substrate Z whose surface is formed of a predetermined film is then guided by the guide roller 50, and transported from the slit 64a of the partition wall 64 to the winding chamber 24.

In the illustrated example, the winding chamber 24 has a guide roller 68, a winding shaft 14 and a vacuum ventilation unit 70.

The substrate Z transported to the winding chamber 24 is guided by the guide roller 68, transported to the winding shaft 14, wound in a roll shape by the winding shaft 14, and provided for the next process as a roll formed by winding the functional film such as the gas barrier film.

In addition, similarly to the above-described supply chamber 18, the winding chamber 24 also has the vacuum ventilation unit 70. Thus, during the film forming, the winding chamber 24 is also decompressed to a degree of vacuum which corresponds to the film forming pressure in the film forming chamber 20.

Hereinafter, referring to FIGS. 1 and 3, an operation of the CVD device 10 will be described, and then a manufacturing method of the functional film of the present invention will be described in more detail.

The right side drawing in FIG. 3 is a conceptual diagram when the drum 38, the film forming electrode 40 and the electrode cover 52 are viewed from the right side (winding chamber 24 side) in FIG. 1 (An arrow b indicates a transporting direction of the substrate Z).

If the substrate roll 12 is mounted on the rotary shaft 28, the substrate Z is pulled out from the substrate roll 12. The substrate pulled out from the substrate roll 12 is guided by the guide roller 30 to reach the film forming chamber 20. In the film forming chamber 20, the substrate Z is guided by the guide rollers 42 and 46, wound around the predetermined region on the circumferential surface of the drum 38, and then guided by the guide rollers 48 and 50 to reach the winding chamber 24. In the winding chamber 24, the substrate Z is guided by the guide roller 68 to reach the winding shaft 14, and is fed through a predetermined transportation route.

If the feeding of the substrate Z is completed, the supply chamber 18, the film forming chamber 20 and the winding chamber 24 are closed (sealed). Then, the vacuum ventilation units 32, 60 and 70 are driven to decompress the supply chamber 18, the film forming chamber 20 and the winding chamber 24 to have a predetermined pressure. If the pressure is stabilized in the respective chambers, the gas supply means 56 supplies the film forming gas to the film forming electrode 40 in the film forming chamber 20.

If the inside of the film forming chamber 20 is stabilized to have the predetermined pressure corresponding to the film forming, the transportation of the substrate Z from the supply chamber 18 toward the winding chamber 24 is started, and in addition, the supply of the plasma excitation power from the high frequency power source 54 to the film forming electrode 40 is started.

Figure 3A:
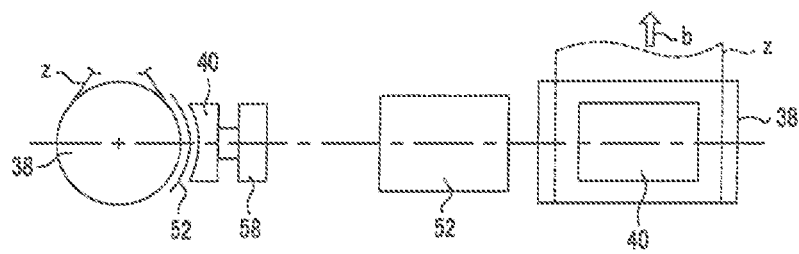
FIGS. 3(A) to 3(C) are conceptual diagrams for illustrating an operation of the plasma CVD device illustrated in FIG. 1.

In this state, as illustrated in FIG. 3(A), the electrode cover 52 is not arranged between the drum 38 and the film forming electrode 40, but is arranged at a position away from the film forming region between the drum 38 and the film forming electrode 40 (position which does not affect the film forming, for example position away in an axial direction a of the drum 38).

The substrate Z transported from the supply chamber 18 to the film forming chamber 20 is guided by the guide rollers 42 and 46, and transported in a wound state around the drum 38. In the region where the drum 38 and the film forming electrode 40 oppose each other, the film having the function as the silicon nitride film is formed by using the CCP-CVD method.

The substrate Z on which a predetermined film is formed is guided by the guide rollers 48 and 50, and transported to the winding chamber 24.

The substrate Z transported to the winding chamber 24 is guided to a predetermined route by the guide roller 68, and wound in a roll shape by the winding shaft 14.

When the predetermined film is formed, for example, when the amount of the substrate Z (remaining amount of the substrate Z) wound around the substrate roll 12 reaches a predetermined length or less, and when the total film forming time from the previous replacement of the film forming electrode 40 reaches the predetermined time, the supply of the plasma excitation power from the high frequency power source 54 to the film forming electrode 40 is stopped, and the supply of the film forming gas from the gas supply unit 56 to the film forming electrode 40 is stopped. Furthermore, the transportation of the substrate Z is stopped and the film forming is stopped (completed).

Then, in order to mount a new substrate roll 12 thereon and replace the film forming electrode 40, the film forming chamber 20, the supply chamber 18 and the winding chamber 24 are exposed to the air.

In the manufacturing method of the present invention, the air exposure may be performed in a state where all the substrates Z are wound around the winding shaft 14. That is, the air exposure may be performed in a state without the substrate Z (state where the substrate Z has been already cut away) in the supply chamber 18 and the film forming chamber 20.

However, since FIG. 1 and the like are conceptual diagrams, only six guide rollers are illustrated. The usual CVD device using R to R has a large number of guide rollers, and thus the feeding of the substrate Z needs more efforts. In addition, if there is no substrate Z, the film formed substrate Z wound around the winding shaft 14 has no tension applied thereto. Accordingly, if the air exposure is performed in this state, the air permeates to between the wound substrates. Therefore, the winding condition of the substrate Z is eventually unsuitable.

Therefore, in the manufacturing method of the present invention, in a state where the substrate Z is fed through the predetermined route (that is, in a state of tension applied from the substrate roll 12 to the winding shaft 14), it is preferable to mount a new substrate roll 12 thereon after performing the air exposure described below.

Figure 3B:
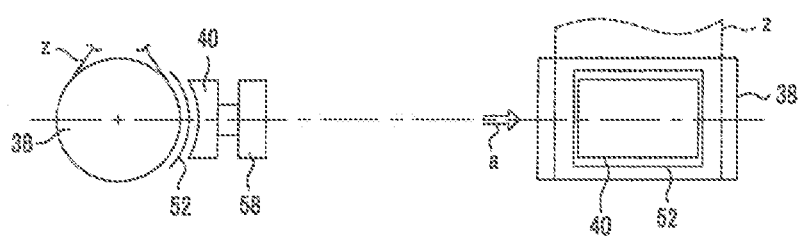

In the CVD device 10, if the film forming is stopped in the above-described manner, as illustrated in FIGS. 3(A) to 3(B), the electrode cover 52 located outside the space between the drum 38 and the film forming electrode 40 is moved in the direction of the arrow a by using the cover moving unit (not illustrated), and is located between the drum 38 and the film forming electrode 40.

Figure 3C:
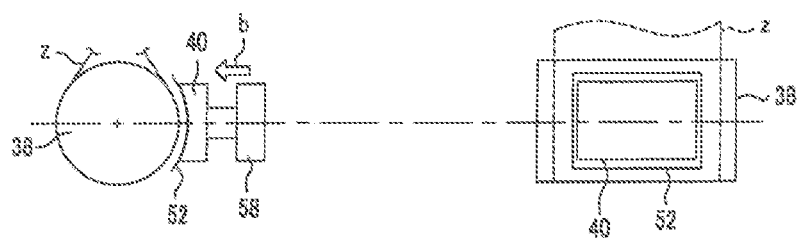

Then, as illustrated in FIGS. 3(B) and 3(C), the electrode moving unit 58 brings the surface of the film forming electrode 40 into contact with the electrode cover 52, and moves the film forming electrode 40 in a direction approaching the drum 38 (in the direction of the arrow b) until the film forming electrode slightly presses the drum 38.

In this manner, as illustrated in FIG. 3(C), the electrode cover 52 comes into contact with the entire surface of the film forming electrode 40, and the entire surface of the film forming electrode 40 is covered with the electrode cover 52.

In the CVD device 10, after the entire surface of the film forming electrode 40 is covered with the electrode cover 52 in this manner, the air exposure unit 26 introduces the air (outside air) into the film forming chamber 20, the supply chamber 18 and the winding chamber 24.

That is, in the manufacturing method of the present invention, in a state where the surface of the film forming electrode 40 (surface opposing the substrate Z (drum 38)) is not exposed inside the film forming system (inside film forming space), in other words, inside the decompressed space for forming the film on the substrate Z, the air for performing the air exposure is introduced into the film forming chamber 20, the supply chamber 18 and the winding chamber 24.

As described above, if the film is formed by the plasma CVD method using R to R, eventually the film adheres to and is deposited on the inside of the film forming system other than the substrate Z. In particular, a large amount of the film adheres to and is deposited on the surface of the film forming electrode 40 which is exposed in the region of generating the plasma, that is, in the region of forming the film (position for forming the film).

If the air is introduced in order to expose the inside of the device to the air in such a state, the film adhering to or deposited on the film forming electrode 40 is separated to generate the particles, and thus the generated particles are scattered in the film forming system to adhere to the entire area inside the film forming system. Therefore, it is necessary to invest a lot of time in cleaning the inside of the film forming system to remove the particles, thereby resulting in significantly degraded productivity.

In addition, as described above, it is preferable to perform the air exposure in a state where the substrate Z has been already fed. However, if the substrate Z is fed and then the air is introduced, the particles adhere to the film formed substrate Z (that is, a product), thereby causing damage to the formed film or contamination of the substrate Z. Furthermore, if the film formed substrate Z to which the particles adhere is wound, the particles are eventually involved in the roll of the film formed substrate Z. As a result, the particles come into contact with or adhere to the adjacent substrate (laminated substrate). This also results in the damage to the formed film or the contamination of the formed film, thereby causing the degraded quality of the product.

In contrast, according to the manufacturing method of the present invention, after the electrode cover 52 covers the surface of the film forming electrode 40, that is, the surface of the film forming electrode 40 is not exposed in the film forming system (the surface of the film forming electrode 40 is hindered from coming into contact with the air inside the film forming system), the air introduction is performed in order to expose the film forming system to the air.

Therefore, according to the present invention, even if the air introduction is performed in order to expose the film forming system to the air, it is possible to considerably suppress the separation of the film adhering to or deposited on the surface of the film forming electrode 40. That is, it is possible to considerably suppress the scattering particles inside the film forming system, which is caused by the air introduction.

As a result, after stopping the film forming, the film forming system can be quickly exposed to the air without need of the slow vent. Furthermore, it is possible to considerably reduce the efforts and time required for cleaning the inside of the film forming system after the air exposure, and thus it is possible to manufacture the functional film with excellent productivity. In addition, even if the air is introduced in a state where the substrate Z has been already fed, as a preferable aspect, it is possible to prevent the particles from adhering to the film formed substrate. Therefore, it is possible to preferably prevent the contamination of the film formed substrate Z, the damage to the film, the contamination of the film formed and wound substrate Z and the damage thereto, which are caused by the particles.

In addition, since the cleaning performance inside the film forming system can be improved, it is possible to suppress the deposition of the particles which cannot be removed inside the film forming system. As a result, it is possible to stably manufacture high quality products for a long period of time by preventing the degraded product quality caused by the contamination inside the film forming system to be deposited.

In the present invention, after the electrode cover 52 covers the surface of the film forming electrode 40, the air exposure unit 26 introduces the air to the film forming chamber 20, the supply chamber 18 and the winding chamber 24.

If this air introduction allows all the chambers to have the atmospheric pressure, the electrode cover 52 and the film forming electrode 40 are caused to return to the same position as the position during the film forming. After completing the air exposure, the moving time for returning the electrode cover 52 and the film forming electrode 40 to the same position as the position during the film forming is not limited to this, but may be appropriately set depending on the conditions of the manufacturing work. In addition, the electrode cover 52 and the film forming electrode 40 may be caused to return to the same position as the position during the film forming, by selecting arbitrary time.

Then, a necessary chamber is exposed such as the film forming chamber 20, the supply chamber 18 and the winding chamber 24.

Thereafter, necessary works are performed such as mounting a new substrate roll 12 (connection of the rear end of the fed substrate Z and the front end of the substrate Z of the new roll, which are cut away), removal of the film formed and wound substrate Z (winding the front end of the cut substrate Z around the winding shaft 14), removal of the film forming electrode 40, cleaning the inside of the film forming chamber 20 and attachment of a new (cleaned) film forming electrode 40.

If the necessary works are completed, the film forming chamber 20, the supply chamber 18 and the winding chamber 24 are closed, and the vacuum ventilation unit 32, 60 and 70 are driven again. Then, if the respective chambers are stabilized to have a predetermined pressure, similarly to the previous process, the supply of the film forming gas, the transportation of the substrate Z, and the supply of the plasma excitation power are started to resume the film forming on the substrate Z.

In the CVD device 10 of the illustrated example, the moving unit for moving the electrode cover 52 and the moving unit for moving the film forming electrode 40 are disposed to move only a linear-shaped (one-dimensional) member. In this manner, the electrode cover 52 covers the surface of the film forming electrode 40.

However, the present invention is not limited to this. That is, the surface of the film forming electrode 40 may be covered with the electrode cover 52 in such a manner that after the electrode cover 52 is inserted to between the drum 38 and the film forming electrode 40, the electrode cover 52 is moved toward the film forming electrode 40, and then the electrode cover is two-dimensionally moved such that the electrode cover 52 covers the surface of the film forming electrode 40.

In addition, the CVD device 10 illustrated in FIGS. 1 and 3 is in a state where during the air introduction for the air exposure, the surface of the film forming electrode 40 is not exposed inside the film forming system since the electrode cover 52 covers the surface of the film forming electrode 40.

However, the manufacturing method of the present invention is not limited to this, but may adopt various methods if the method is configured such that during the air introduction for the air exposure, the surface of the film forming electrode 40 is not in an exposed state inside the film forming system (in a state where the surface of the film forming electrode 40 is hindered from coming into contact with the air inside the film forming system).

Figure 2:
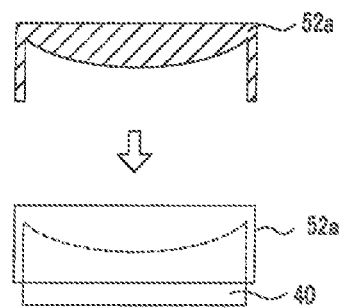
FIG. 2 is a conceptual diagram illustrating another example of an electrode cover used for a manufacturing method of a functional film according to the present invention.
Figure 4A:
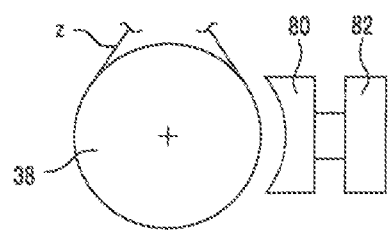
FIGS. 4(A) and 4(B) are conceptual diagrams for illustrating another example of a manufacturing method of a functional film according to the present invention.
Figure 4B:
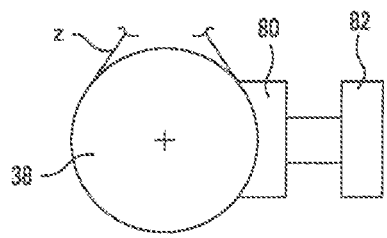

In the example illustrated in FIGS. 4 and 5, the same reference numerals are given to the same members as those in FIGS. 1 to 3, and different portions will be mainly described.

As is similar to a film forming electrode 80 conceptually illustrated in FIG. 4, an example includes a method where the surface of the film forming electrode 80 is allowed to be a convex surface having the same curvature as that of the drum 38 (alternatively, a convex surface having the same curvature in view of the thickness of the substrate Z), and the circumferential surface of the drum 38 (substrate Z which has been fed) is brought into contact with the entire surface of the film forming electrode 80 to cover the surface of the film forming electrode 80.

That is, a counter electrode may entirely cover a surface of a film forming electrode in such a manner that the surface of the film forming electrode and the surface of the counter electrode (surface opposing the film forming surface) are allowed to have a shape (uneven shape) which enables the surfaces to entirely come into contact with each other, and during the air introduction for the air exposure, the film forming electrode and/or the counter electrode is moved to entirely cover the surface of the film forming electrode.

In the example illustrated in FIG. 4, as illustrated in FIG. 4(A), during the film forming, the film forming electrode 80 and the drum 38 which is the counter electrode are away from each other with a predetermined distance, and the plasma is generated between the film forming electrode 80 and the drum 38 so as to form the film on the substrate Z.

Similarly to the previous example, if the film forming on the substrate Z is stopped, a electrode moving unit 82 moves the film forming electrode 80 toward the drum 38, and the circumferential surface (substrate Z) of the drum 38 and the surface of the film forming electrode 80 are entirely brought into contact with each other. Preferably, the drum 38 is slightly pressed by the film forming electrode 80. Similarly to the previous electrode moving unit 58, the electrode moving unit 82 can adopt various known moving units which can be driven in a vacuum.

In this manner, after the drum 38 is caused to cover the entire surface of the film forming electrode 80, and the surface of the film forming electrode 80 is not in an exposed state inside the film forming system (in a state where the surface of the film forming electrode 80 is hindered from coming into contact with the air inside the film forming system), similarly to the previous example, the air exposure unit 26 introduces the air to the film forming chamber 20, the supply chamber 18 and the winding chamber 24 to expose the respective chambers to the air.

Even in this example, similarly to the previous example illustrated in FIGS. 1 and 3, the entire surface of the film forming electrode 80 is covered with the drum 38, and thus is not exposed inside the film forming system. Accordingly, it is possible to considerably suppress the separation of the film from the surface of the film forming electrode 80 and the scattering of the particles inside the film forming system, which are caused by the air introduction.

Here, as illustrated in FIG. 4, even if the surface of the film forming electrode 80 is covered with the drum 38 (counter electrode), it is preferable to perform the air exposure in a state where the substrate Z has been already fed.

In addition to the above-described various benefits, this can prevent mutual damage resulting from mutual contact, since the film forming electrode 80 and the drum 38 do not directly come into contact with each other.

In addition, immediately after stopping the film forming, the film forming electrode 80 is very hot. Therefore, if the film forming electrode 80 is brought into contact with the substrate Z immediately after stopping the film forming, the substrate Z may be damaged due to the heat.

On the other hand, the length of the substrate Z to be wound around the substrate roll 12 is of course known. Thus, it is possible to predict which region of the substrate Z reaches a position (film forming region) opposing the film forming electrode 80 when the film forming is stopped.

Taking advantage of this point, the region corresponding to the position opposing the film forming electrode 80 in the elongated substrate Z when stopping the film forming (predicted region) may be formed of a resin such as polyimide, which has high heat resistance. Furthermore, in order to more preferably allow the film forming electrode 80 to adhere to the substrate Z (drum 38), the region corresponding to the position opposing the film forming electrode 80 of the substrate Z when the film forming is stopped may be formed of a material having elasticity in addition to the heat resistance.

In addition, the present invention is not limited to the method of covering the surface of the film forming electrode with a certain member, as a method where the surface of the film forming electrode 40 is not in an exposed state inside the film forming system (in a state where the surface of the film forming electrode 40 is hindered from coming into contact with the air inside the film forming system) during the air introduction for the air exposure.

For example, the surface of the film forming electrode 40 may be in a non-exposed state inside the film forming system by using a so-called load lock mechanism and by moving the film forming electrode to the other space separated from the film forming system (more preferably the other space separated from the film forming system (film forming space) and maintaining airtightness) during the air introduction for the air exposure.

FIG. 5 conceptually illustrates the example.

In the example illustrated in FIG. 5, inside the film forming chamber 20, a load lock chamber 86 (evacuation chamber of the film forming electrode 40) and a cover body 90 of the load lock chamber 86 are disposed, and an air introduction unit 92 to the load lock chamber 86 and a moving unit (not illustrated) of the film forming electrode 40 are further disposed.

Similarly to the above-described electrode moving unit 58, the moving unit of the film forming electrode 40 can adopt various known moving units which can be driven in a vacuum.

Figure 5A:
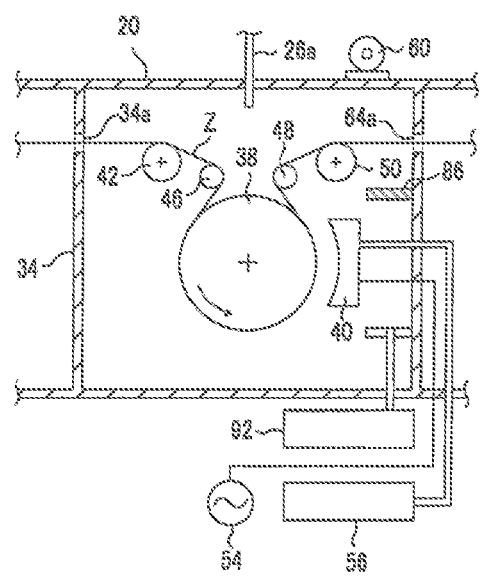
FIGS. 5(A) and 5(B) are conceptual diagrams for illustrating another example of a manufacturing method of a functional film according to the present invention.

In the device, during the film forming on the substrate Z, as illustrated in FIG. 5(A), the film forming electrode 40 is arranged at a position outside the load lock chamber 86, which is away from the drum 38 with a predetermined distance. The plasma is generated between the film forming electrode 80 and the drum 38 so as to form the film on the substrate Z. In addition, the cover body 90 (not illustrated in FIG. 5(A)) is evacuated to a position which does not affect the film forming.

Figure 5B:
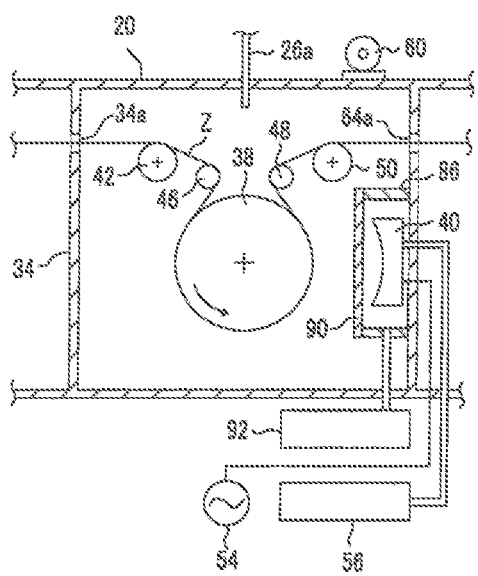

Similarly to the previous example, as illustrated in FIG. 5(B), if the film forming on the substrate Z is stopped, the film forming electrode 40 is moved to a direction away from the drum 38 by the moving unit of the film forming electrode 40, and accommodated in the load lock chamber 86. Then, a moving unit (not illustrated) moves the cover body 90, and the cover body 90 closes the load lock chamber 86 to maintain the airtightness. This allows the surface of the film forming electrode 40 to be in the non-exposed state inside the film forming system.

Similarly to the above-described example, the moving unit of the cover body 90 can also adopt various known moving units which can be driven in a vacuum.

In this manner, the film forming electrode 40 is accommodated in the load lock chamber 86, and then the cover body 90 closes the load lock chamber 86 to keep the inside of the load lock chamber 86 in an airtight state. Thereafter, similarly to the previous example, the air exposure unit 26 introduces the air to the film forming chamber 20, the supply chamber 18 and the winding chamber 24 so as to expose the respective chambers to the air.

In addition, concurrently, the air introduction unit 92 introduces the air (atmosphere) to the load lock chamber 86 so as to allow the inside of the load lock chamber 86 to have the atmospheric pressure. In this manner, the film forming electrode 40 can be removed from the load lock chamber 86.

In this example, the film forming electrode 40 is located in the load lock chamber 86 away from the inside of the film forming system in an airtight manner. Accordingly, the film separated from the surface of the film forming electrode 40 is scattered only inside the load lock chamber 86. Therefore, even if the air is introduced to the respective chambers in order to expose the film forming chamber 20 to the air, it is possible to considerably suppress the scattering of the particles inside the film forming system.

Hitherto, the manufacturing method of the functional film according to the present invention has been described in detail. The present invention is not limited to the above-described embodiments, but can be of course variously improved or modified within the scope without departing from the gist of the present invention.

For example, the example illustrated in FIG. 1 includes a device for forming the film while transporting the substrate Z in the longitudinal direction in a state where the substrate Z is wound around the circumferential surface of the cylindrical drum. However, the present invention is not limited to the device. For example, the manufacturing method of the present invention can be preferably adapted to a device for forming the film while transporting the substrate Z linearly (in a planar shape). That is, according to the manufacturing method of the present invention, all the film forming devices having various configurations can be adopted if there is provided a device for forming the film by using the plasma CVD method while transporting an elongated substrate in the longitudinal direction.

EXAMPLES

Example 1

A silicon nitride film is formed on the surface of the substrate Z to manufacture a gas barrier film by using the CVD device 10 as illustrated in FIGS. 1 and 3.

The drum 38 adopts a drum made of stainless steel having a temperature adjusting unit and a diameter of 1,500 mm.

The substrate Z adopts a PET film of 100 μm in thickness.

The film forming gas adopts silane gas ($SiH_4$), ammonia gas ($NH_3$), nitrogen gas ($N_2$) and hydrogen gas ($H_2$). The supply amount is set to silane gas of 100 sccm, ammonia gas of 200 sccm, nitrogen gas of 500 sccm and hydrogen gas of 500 sccm. In addition, the film forming pressure is set to 50 Pa.

The plasma excitation power of 3,000 W with the frequency of 13.5 MHz is supplied to the film forming electrode 40 from the high frequency power source 54. Furthermore, a bias power of 500 W is supplied to the drum 38 from a power source (not illustrated). In addition, the temperature of the drum 38 is adjusted to −20° C. during the film forming.

Under the above-described film forming conditions, in the above-described manner, the silicon nitride film of 100 nm in thickness is formed on the substrate Z. Similarly to the above-described example, the electrode cover 52 is evacuated from between the drum 38 and the film forming electrode 40 during the film forming.

At the time when the film of 1,000 m is formed (that is, at the time when the gas barrier film of 1,000 m is manufactured), the supply of the film forming gas, the plasma excitation power and the bias power is stopped, and further the transportation of the substrate Z is stopped to stop the film forming.

Then, as illustrated in FIGS. 3(A) to 3(C), the electrode cover 52 is inserted to between the drum 38 and the film forming electrode 40 by using the cover moving unit. Furthermore, the electrode moving unit 58 moves the film forming electrode 40 toward the drum 38, and slightly presses the film forming electrode 40 to the electrode cover 52 such that the electrode cover 52 covers the entire surface of the film forming electrode 40.

In this manner, after the electrode cover 52 covers the entire surface of the film forming electrode 40, the air exposure unit 26 introduces the air (air outside the device) to the film forming chamber 20, the supply chamber 18 and the winding chamber 24 so as to allow the respective chambers to recover the atmospheric pressure.

The period of time from the start of the air introduction until all the chambers are allowed to have the atmospheric pressure is 40 minutes.

Example 2

As is completely similar to Example 1, the silicon nitride film of 100 nm in thickness is formed on the substrate Z to manufacture the gas barrier film by using the CVD device having the film forming chamber 20 illustrated in FIG. 5.

In the CVD device, the film forming chamber 20 does not have the electrode cover 52, the electrode moving unit 58 and the cover moving unit, but has the load lock chamber 86, the moving unit of the film forming electrode 40, the cover body 90 and the moving unit of the cover body 90. The CVD device has the completely same configuration as the CVD device 10 used in Example 1 other than the configuration illustrated in FIG. 5.

Similarly to Example 1, at the time when the film of 1,000 m is formed, the supply of the film forming gas, the plasma excitation power and the bias power is stopped, and further the transportation of the substrate Z is stopped to stop the film forming.

Then, the film forming electrode 40 is accommodated in the load lock chamber 86, and the cover body 90 closes the load lock chamber 86 in the airtight manner. Then, as is completely similar to Example 1, the air exposure unit 26 introduces the air to the chambers, and the respective chambers recover the atmospheric pressure. In addition, the air introduction unit 92 introduces the air thereto and the load lock chamber 86 is also exposed to the air. The period of time from the start of the air introduction until all the chambers are allowed to have the atmospheric pressure is 40 minutes.

Comparative Example 1

As is completely similar to Example 1, the silicon nitride film of 100 nm in thickness is formed on the surface of the substrate Z and the gas barrier film is manufactured.

As is similar to Example 1, at the time when the film of 1,000 m is formed, the supply of the film forming gas, the plasma excitation power and the bias power is stopped, and further the transportation of the substrate Z is stopped to stop the film forming.

Then, when the electrode cover 52 does not cover the surface of the film forming electrode 40 such that the surface of the film forming electrode 40 is in an uncovered state inside the film forming system, as is completely similar to Example 1, the air exposure unit 26 introduces the air to the respective chambers to recover the atmospheric pressure. The period of time from the start of the air introduction until all the chambers are allowed to have the atmospheric pressure is 40 minutes.

Evaluation

In Example 1, Example 2 and the Comparative Example which are described above, after performing the air exposure, the film formed substrate Z is sampled from the section between the guide roller 48 and the slit 64a, and the sample is observed by using an optical microscope. As a result, in Example 1 and Example 2, the separation or cracking of the formed silicon nitride film is not recognized. In contrast, in Comparative Example, the separation or cracking of the formed silicon nitride film is confirmed.

In addition, a moisture vapor transmission rate $[g/(m^2 \cdot day)]$ of the sampled substrate Z (gas barrier film) is measured by using a calcium corrosion method (method disclosed in JP2005-283561A). As a result, the moisture vapor transmission rate is $1.2 \times 10^{-3}$ $[g/(m^2 \cdot day)]$ in Example 1, $1.7 \times 10^{-3}$ $[g/(m^2 \cdot day)]$ in Example 2, and $7.4 \times 10^{-1}$ $[g/(m^2 \cdot day)]$ in Comparative Example.

In addition, in Example 1 and the Comparative Example, after performing the air exposure, the inside of the device is cleaned and in the completely similar manner, the silicon nitride film is formed again on the substrate of 1,000 m.

In Example 1, since the contamination inside the device due to the particles is very insignificant, the cleaning work inside the device is completed in approximately 30 minutes, and the film forming for the second time can be quickly started. In contrast, in the Comparative Example, the particles are scattered inside the entire device and adhere to the wall surface. Thus, it takes approximately 90 minutes to clean the inside of the device.

Ten pieces of the substrate Z on which the silicon nitride film is formed for the second time are sampled at 100 m intervals not only from the section between the guide roller 48 and the slit 64a, but also from the region wound around the winding shaft 14. Similarly to the previous example, the moisture vapor transmission rate $[g/(m^2 \cdot day)]$ is measured.

As a result, in Example 1, the moisture vapor transmission rate of all the samples is approximately $1.2 \times 10^{-3}$ $[g/(m^2 \cdot day)]$. In contrast, the moisture vapor transmission rate obtained from the section between the guide roller 48 and the slit 64a in Comparative Example is $7.4 \times 10^{-1}$ $[g/(m^2 \cdot day)]$ similarly to the previous samples. The moisture vapor transmission rate of the samples obtained from the region wound around the winding shaft 14 is approximately $2.5 \times 10^{2}$ $[g/(m^2 \cdot day)]$.

As is in the related art, in the Comparative Example where the air introduction for the air exposure is performed in a state where the surface of the film forming electrode 40 is exposed inside the film forming system, the air introduction causes the film adhering to and/or deposited on the surface of the film forming electrode 40 to be separated to generate the particles, and thus the generated particles are scattered in the device. It is considered that this result causes the damage to the silicon nitride film and degraded gas barrier properties.

In contrast, in Example 1 and Example 2 where the air introduction for the air exposure is performed in a state where the surface of the film forming electrode 40 is not exposed inside the film forming system, the damage to the silicon nitride film and the degraded gas barrier properties are not recognized. From a viewpoint of this result, it is considered that in Example 1 and Example 2 where the air introduction is performed in a state where the surface of the film forming electrode 40 is not exposed inside the film forming system, it is possible to considerably suppress the separation of the film adhering to and deposited on the surface of the film forming electrode 40 and the scattering of the particles inside the device.

In addition, in Example 1, the film forming for the second time enables the entire film formed area to have proper gas barrier properties.

In contrast, in the Comparative example, since there are a lot of particles adhering to the inside of the device, it is believed that the particles cannot be completely removed even by the cleaning work. Therefore, it is considered that during the film forming for the second time, the particles remaining on the guide roller or the like eventually adhere to the front and rear surfaces of the substrates Z or the silicon oxide film, this causes the damage to the silicon oxide film and thus the gas barrier properties are degraded in the entire film formed area. That is, in the Comparative Example, the particles remaining during the previous film forming and/or cleaning adversely affect the subsequent film forming, and consequently the proper performance cannot be obtained in the entire area of the product.

INDUSTRIAL APPLICABILITY

The present invention can be preferably applied to manufacturing of various type of functional films such as manufacturing of gas barrier films and anti-reflection films.

What is claimed is:

1. A manufacturing method of a functional film, comprising:
    forming a film on a surface of a substrate by using a plasma CVD method while transporting the elongated substrate in the longitudinal direction;
    stopping the film forming on the substrate; and
    exposing an inside of a film forming system to the air,
    wherein the exposing the inside of the film forming system to the air is conducted by introducing the air into the film forming system in a state where a surface of a film forming electrode for forming the film using the plasma CVD method is hindered from coming into contact with the air inside of the film forming system,
    further comprising:
    covering the surface of the film forming electrode with a predetermined cover to hinder the surface of the film forming electrode from coming into contact with the air inside the film forming system,
    wherein the covering the surface of the film forming electrode with the predetermined cover is conducted by moving and inserting the predetermined cover to between the film forming electrode and a counter electrode forming an electrode pair with the film forming electrode, followed by moving the film forming electrode.

2. The manufacturing method of a functional film according to claim 1,
    wherein the predetermined cover has a shape capable of covering the surface of the film forming electrode to come into contact with the entire surface of the film forming electrode.

3. The manufacturing method of a functional film according to claim 1,
    wherein the surface of the film forming electrode is hindered from coming into contact with the air inside the film forming system in a state where the elongated substrate passes through a predetermined transportation route.

4. The manufacturing method of a functional film according to claim 1,
    wherein the forming the film on the surface of the substrate by using the plasma CVD method while transporting the elongated substrate in the longitudinal direction is conducted in a state where the elongated substrate is wound around a cylindrical drum, and
    the cylindrical drum is caused to act as the counter electrode forming an electrode pair with the film forming electrode.

5. The manufacturing method of a functional film according to claim 1, further comprising:
    wherein the forming the film is conducted while feeding the substrate from a substrate roll which is formed by winding the elongated substrate in a roll shape, and
    the film formed substrate is wound again in the roll shape.

6. The manufacturing method of a functional film according to claim 1,
    wherein the film forming electrode is provided with a supply unit for supplying film forming gas to form the film by using the plasma CVD method.

* * * * *